(12) United States Patent
Dutta et al.

(10) Patent No.: US 12,058,942 B2
(45) Date of Patent: Aug. 6, 2024

(54) MRAM CELL EMBEDDED IN A METAL LAYER

(71) Applicant: International Business Machines Corporation, Armonk, NY (US)

(72) Inventors: Ashim Dutta, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 406 days.

(21) Appl. No.: 17/513,108

(22) Filed: Oct. 28, 2021

(65) Prior Publication Data
US 2023/0136650 A1     May 4, 2023

(51) Int. Cl.
  *H10N 50/80*  (2023.01)
  *H10B 61/00*  (2023.01)
  *H10N 50/01*  (2023.01)

(52) U.S. Cl.
  CPC .............. *H10N 50/80* (2023.02); *H10B 61/00* (2023.02); *H10N 50/01* (2023.02)

(58) Field of Classification Search
  CPC ........ H10N 50/80; H10N 50/01; H10N 50/85; H10B 61/00; H10B 61/22
  See application file for complete search history.

(56) References Cited

U.S. PATENT DOCUMENTS

| | | | |
|---|---|---|---|
| 9,343,659 B1 | 5/2016 | Lu | |
| 9,401,385 B2 | 7/2016 | Seo | |
| 9,595,662 B2 | 3/2017 | Li | |
| 9,780,301 B1 | 10/2017 | Chuang | |
| 2012/0032287 A1* | 2/2012 | Li | H10N 50/10 257/E27.103 |
| 2013/0119494 A1 | 5/2013 | Li | |
| 2016/0093668 A1* | 3/2016 | Lu | H01L 23/528 257/421 |
| 2016/0365505 A1* | 12/2016 | Lu | H10N 50/85 |
| 2018/0006085 A1* | 1/2018 | Chuang | H10B 61/22 |
| 2019/0140019 A1* | 5/2019 | Nagel | H10N 50/01 |
| 2019/0165042 A1* | 5/2019 | Clevenger | H10N 50/01 |

(Continued)

FOREIGN PATENT DOCUMENTS

WO     2021055113 A1     3/2021

OTHER PUBLICATIONS

Appeltans, Raf, "Embedded STT-MRAM cell design in and beyond 10 nm finFET nodes Making the link to the physical implementation", Dissertation presented in partial fulfillment of the requirements for the degree of Doctor of Engineering Science (PhD): Electrical Engineering, Arenberg Doctoral School, Aug. 2017, 174 pages, <https://lirias.kuleuven.be/retrieve/461161>.

*Primary Examiner* — J. E. Schoenholtz
(74) *Attorney, Agent, or Firm* — Gavin Giraud

(57) ABSTRACT

Embodiments disclosed herein include a semiconductor structure. The semiconductor structure may include a magnetoresistive random access memory (MRAM) cell with a memory array landing pad contacting a first bottom metal level contact and an MRAM pillar electrically connected to the memory array landing pad. The semiconductor structure may also include a logic interconnect contacting a second bottom metal level contact and a dielectric cap above the MRAM cell and the logic interconnect. The MRAM cell and logic interconnect may be electrically connected to a top metal level through the dielectric cap.

22 Claims, 7 Drawing Sheets

(56) References Cited

U.S. PATENT DOCUMENTS

| | | | |
|---|---|---|---|
| 2019/0355668 A1* | 11/2019 | Rizzolo | H10B 61/00 |
| 2020/0098982 A1* | 3/2020 | Chuang | H10B 61/22 |
| 2020/0212297 A1 | 7/2020 | Yang | |
| 2020/0350491 A1 | 11/2020 | Chuang | |
| 2021/0126191 A1 | 4/2021 | Wang | |

* cited by examiner

MRAM CELL EMBEDDED IN A METAL LAYER

BACKGROUND

The present invention relates generally to the field of magnetoresistive random access memory (MRAM), and more particularly to a multiple-tier MRAM structure that increases density of MRAM cells without suffering from shorting.

MRAM is a type of non-volatile random-access memory (RAM) which stores data in magnetic domains. Unlike conventional RAM technologies, data in MRAM is not stored as electric charge or current flows, but by magnetic storage elements formed from two ferromagnetic plates, each of which can hold a magnetization, separate by a thin insulating layer. One of the two plates is a permanent magnet set to a particular polarity. The magnetization of the other plate can be changed to match that of an external field to store memory. Cell density is a high determinant for performance and cost in a memory system. Smaller, fewer, or more tightly packed MRAM cells mean that more memory storage can be produced at once from a single silicon wafer, and devices that use the memory will have more storage capacity.

SUMMARY

Aspects of an embodiment of the present invention include a semiconductor structure. The semiconductor structure may include a magnetoresistive random access memory (MRAM) cell with a memory array landing pad contacting a first bottom metal level contact and an MRAM pillar electrically connected to the memory array landing pad. The semiconductor structure may also include a logic interconnect contacting a second bottom metal level contact and a dielectric cap above the MRAM cell and the logic interconnect. The MRAM cell and logic interconnect may be electrically connected to a top metal level through the dielectric cap.

Aspects of an embodiment of the present invention include methods of fabricating a semiconductor structure. The methods may include forming a memory array landing pad on a first bottom metal level contact, forming a magnetoresistive random access memory (MRAM) cell on the memory array landing pad, forming interlayer dielectric (ILD) over the MRAM cell, and forming a logic interconnect through the ILD. The logic interconnect may contact a second bottom metal level contact.

Aspects of an embodiment of the present invention include a semiconductor structure. The semiconductor structure may include a bottom metal level comprising a memory array metal level contact and a logic metal level contact, a top metal level comprising a first top wire and a second top wire, a magnetoresistive random access memory (MRAM) cell electrically connected between the memory array metal level contact and the first top wire, a logic interconnect electrically connected between the logic metal level contact and the second top wire, and a dielectric cap directly contacting a top of the logic interconnect, and located between the first top wire and the MRAM cell.

DETAILED DESCRIPTION

Figure 1:
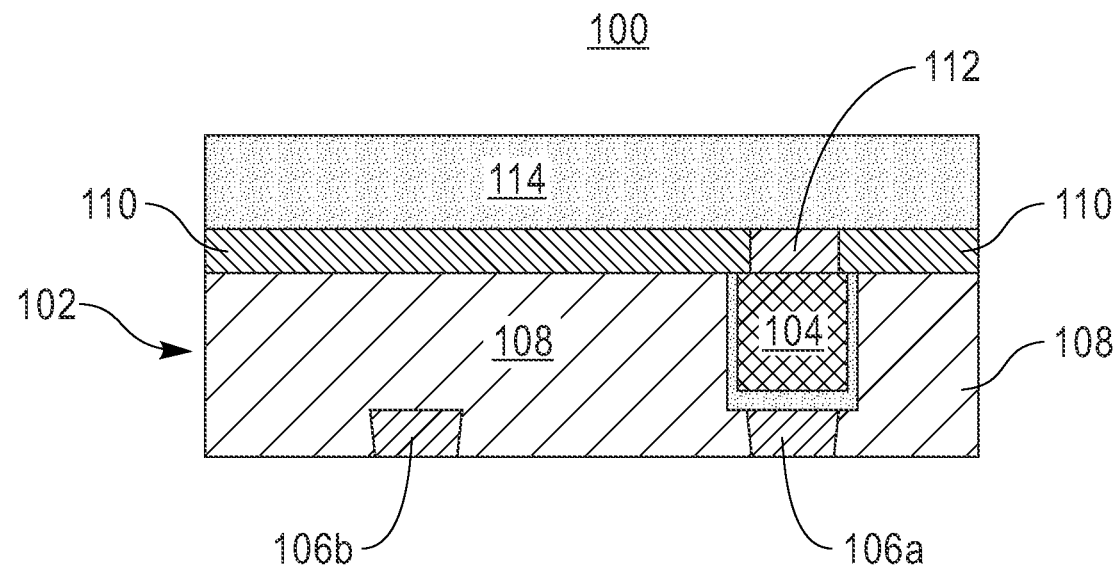
FIG. 1 depicts schematic cross-sectional diagram of a semiconductor structure, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

In the fabrication of embedded magnetoresistive random access memory (MRAM) devices within the metal contact layers of a semiconductor structure, an MRAM pillar is formed as part of the MRAM cell. The MRAM pillars/cells may be fabricated concurrently with the metal contact layers that are fabricated for the logic portion of the circuit. That is, all of the metal contacts for one metal layer are fabricated as contact wires at a first level of interlayer dielectric (ILD). Then, the MRAM pillars are formed above a specified number of the metal contacts, and the logic contacts are formed above the remaining metal contacts. This fabrication order, however, leaves little room for the MRAM pillars, especially 14 nm logic technology node and beyond due to limited interlayer spacing between first and second metal levels. In addition, the logic area can suffer significant dielectric gouging and risk of damage due to extended ion beam etch (IBE) over etch and longer sidewall cleanup when the MRAM pillars have tight pitch.

Disclosed embodiments, therefore, propose a structure of embedded MRAM devices where the MRAM memory cells are formed before metal lines of a metal contact level are formed in logic area. The logic contacts, and the protective dielectric are therefore not at risk of being damaged by the patterning of MRAM memory cells. The metal lines of the metal contact level adjacent to the MRAM cells, meaning that the metal lines and the MRAM cells are formed at the same level. Independent formation of the MRAM cells and the metal lines enables an uninhibited formation of the MRAM cells, which eliminates the requirement of reducing MRAM cell height to fit it in between limited inter-metal spacing between a first metal level and a second metal level above the first metal level.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "certain embodiments," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "above," "below," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. Each reference number may refer to an item individually or collectively as a group. For example, memory array landing pad 104 may refer to a single memory array landing pad 104 or multiple memory array landing pads 104.

The present invention will now be described in detail with reference to the Figures.

FIG. 1 depicts a schematic cross-sectional side view of a semiconductor structure 100 at a first metal level 102. The metal level 102 may, for example, be a back-end of line (BEOL) layer in a logic area of the semiconductor structure 100. The semiconductor structure 100 may include a memory array landing pad 104 that is connected through a memory array metal level contact 106a to an additional metal level below the first metal level 102, or a front end of line (FEOL) level comprising transistor devices located below the first metal level 102. The memory array landing pad 104 may be formed of electrically conductive materials such as copper, tungsten, cobalt, ruthenium, aluminum, other metals, or conductive non-metals. The first metal level 102 may also include a logic metal level contact 106b that is contacted to the lower metal level or FEOL level.

The memory array landing pad 104 is insulated from other components by interlayer dielectric (ILD) 108 and a dielectric cap 110. The ILD 108 may include a non-crystalline solid material such as silicon dioxide ($SiO_2$) undoped silicate glass (USG), tetraethyl orthosilicate (TEOS), low-k dielectric, or ultra low-k dielectric materials, fluorosilicate glass (FSG), borophosphosilicate glass (BPSG), a spin-on low-k dielectric layer, a chemical vapor deposition (CVD) low-k dielectric layer or any combination thereof. The term "low-k" as used in the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD 108. The use of a self-planarizing dielectric material as ILD 108 may avoid the need to perform a subsequent planarizing step. The dielectric cap 110 may include SiN, SiC, SiCN(H), or other silicon compounds for insulating.

In the fabrication stage illustrated in FIG. 1, the logic metal level contact 106b is surrounded by the ILD 108 and does not electrically contact a logic interconnect in the first metal level 102. This is by design, and the landing pad will be added later after some etching steps are completed that may otherwise damage the logic interconnect. The memory array metal level contact 106a, conversely, electrically connects to the memory array landing pad 104, a pillar contact 112, and magnetoresistive random access memory (MRAM) layers 114 of the semiconductor structure 100. The MRAM layers 114 may be fabricated using known deposition processes such as chemical vapor deposition (CVD), atomic layer deposition (ALD), and/or physical vapor deposition (PVD). The MRAM layers 114 may include, a bottom and top MRAM electrode layers formed from Nb, NbN, W, WN, Ta, TaN, Ti, TiN, Ru, Mo, Cr, V, Pd, Pt, Rh, Sc, Al and other high melting point metals or conductive metal nitrides.

The MRAM layers 114 may include magnetic tunnel junction (MTJ) material that enables a magnetic field to change based on electric signals sent through an MRAM cell. For example, the MRAM layers 114 may include reference layers, tunnel barriers, and free layers. The reference layers may be made of a ferromagnetic material such as NiFe, NiFeCo, CoFe, CoFeB, Co, Ni, Cu, Ta, Ti, Zr, Au, Ru, Cr, Pt, CoPt, CoCrPt, FeNi, FeTa, FeTaCr, FeAl, FeZr, NiFeCr, or NiFeX. The ferromagnetic material enables a permanent magnetic field to be maintained in a fixed orientation, typically identified as a down orientation or an up orientation. The tunnel barriers may be made of magnesium oxide, magnesium aluminum oxide, aluminum oxide, combinations of these, or other dielectric materials. The free layers may be made of a magnetic material that enables the magnetic orientation to switch depending on a signal passed vertically through the finished MRAM cells. In general, the free layers include a ferromagnetic layer capable of being changed in magnetization state. In some embodiments, the free layers are a composite free layer that includes multiple ferromagnetic and coupling sub-layers.

Figure 2:
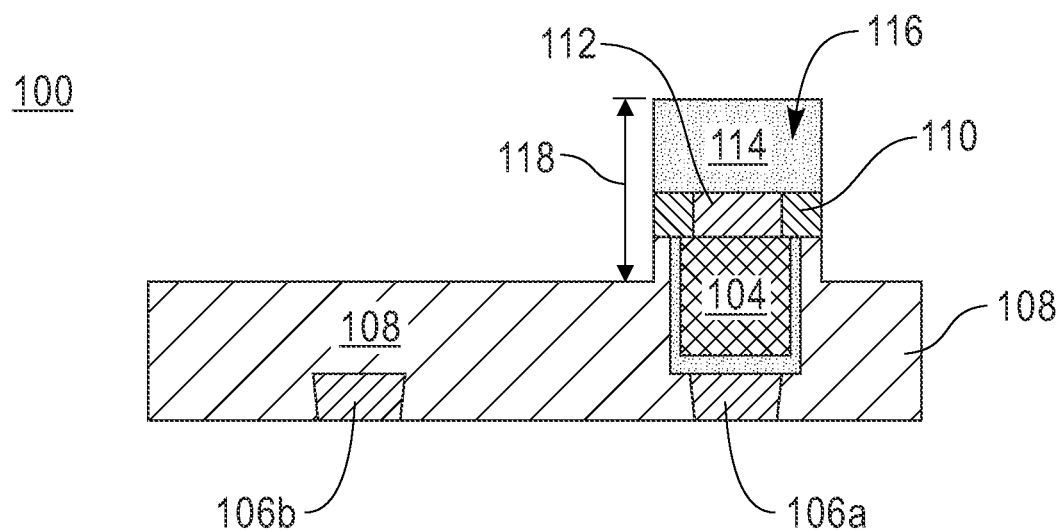
FIG. 2 depicts a schematic cross-sectional side view of the semiconductor structure of FIG. 1, in accordance with one embodiment of the present invention.

FIG. 2 depicts a schematic cross-sectional side view of the semiconductor structure 100 of FIG. 1, in accordance with one embodiment of the present invention. FIG. 2 shows the semiconductor structure 100 with an MRAM pillar 116 formed using a masked etch process (e.g., lithographic patterning followed by RIE and IBE), whereby a masking material (not shown) blocks areas of the semiconductor structure 100 while the unmasked areas are etched away. The MRAM pillar 116 may thus be etched at a depth 118 that penetrates through the MRAM layers 114, the dielectric cap 110, and some portion of the ILD 108. In embodiments of the semiconductor structure 100 that include a logic interconnect at this stage of the fabrication, the depth 118 must not penetrate further than the dielectric cap 110, and must in fact keep a significant portion of the dielectric cap 110 to avoid migration of the logic interconnect and other operational degradation. In the illustrated embodiment, on the other hand, if the depth 118 is over-etched or under-etched, the operation of the semiconductor structure 100 will remain largely unaffected.

Figure 3:
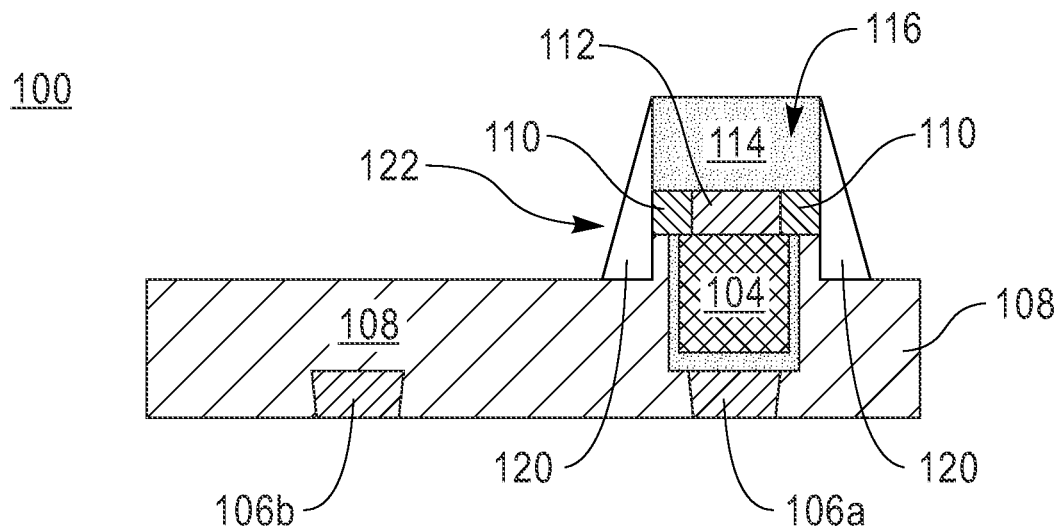
FIG. 3 depicts a schematic cross-sectional side view of the semiconductor structure of FIG. 1, in accordance with one embodiment of the present invention.

FIG. 3 depicts a schematic cross-sectional side view of the semiconductor structure 100 of FIG. 1, in accordance with one embodiment of the present invention. FIG. 3 shows encapsulating the MRAM pillar 116 with an encapsulation spacer 120 to form an MRAM cell 122. The encapsulation spacer 120 may be formed of the same or similar material to the dielectric cap 110, namely SiN, SiC, SiCN(H), or other silicon compounds for insulating. Encapsulating with the encapsulation spacer 120 may include a blanket deposition of the encapsulation material followed by etching back the encapsulation spacer 120. The encapsulation spacer 120 may vertically overlap at least a portion of the memory array landing pad 104 due to the depth 118 of the etch back being etched through the MRAM layers 114 and the dielectric cap 110. The etch back of the encapsulation material may be done using anisotropic etch processes so that encapsulation material is only removed from all the horizontal surfaces. As with the depth 118 described in FIG. 2, the etch-back of the encapsulation spacer 120 has greater flexibility due to the lack of a logic interconnect. That is, the etch-back of the encapsulation spacer 120 is not limited by the dielectric cap 110. Since the dielectric cap 110 is not protecting a logic interconnect, then the etch-back of the encapsulation spacer 120 may be cleanly and thoroughly etched from the ILD 108.

Figure 4:
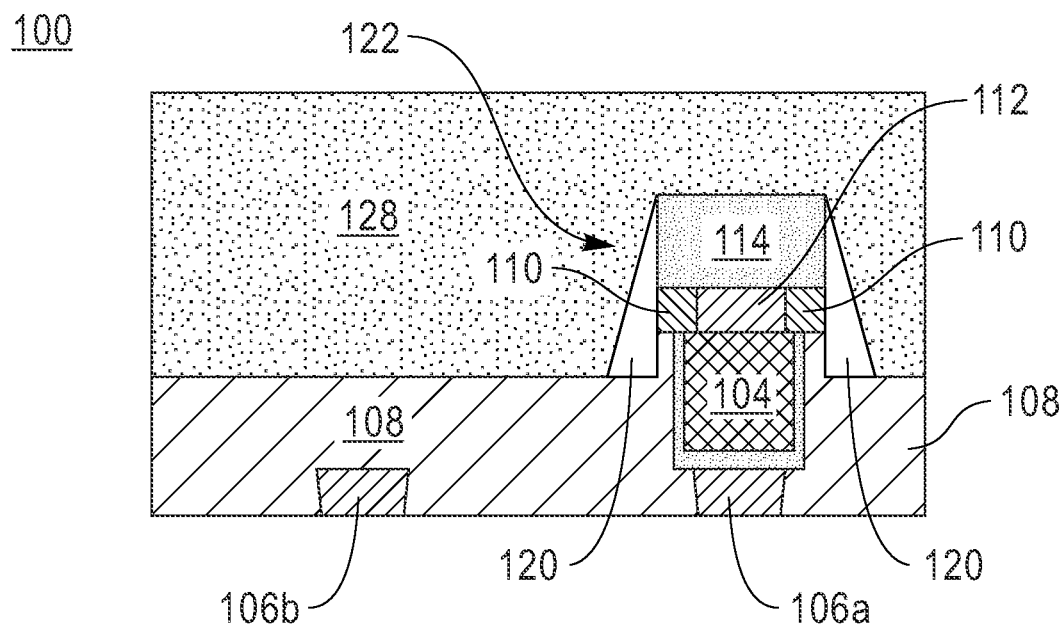
FIG. 4 depicts a schematic cross-sectional side view of the semiconductor structure of FIG. 1, in accordance with one embodiment of the present invention.

FIG. 4 depicts a schematic cross-sectional side view of the semiconductor structure 100 of FIG. 1, in accordance with one embodiment of the present invention. FIG. 4 shows the semiconductor structure 100 with a second ILD 128 formed on the first ILD 108 and over the MRAM cell 122. The second ILD 128 may be formed of the same material as the first ILD 108, or may include a different composition. From the fabrication stage illustrated in FIG. 4, the semiconductor structure 100 may be fabricated in according to different embodiments that are illustrated below. A first embodiment continues in FIGS. 5-7, a second embodiment includes FIGS. 5, 8, and 9, and a third embodiment continues in FIGS. 10-12.

Figure 5:
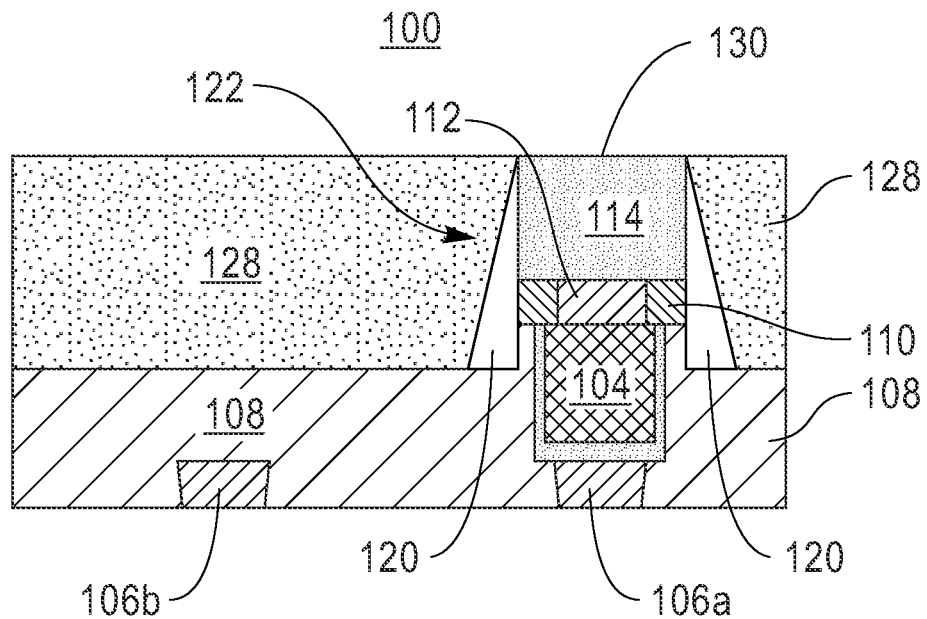
FIG. 5 depicts a schematic cross-sectional side view of the semiconductor structure of FIG. 1, in accordance with one embodiment of the present invention.

FIG. 5 depicts a schematic cross-sectional side view of the semiconductor structure 100 of FIG. 1, in accordance with one embodiment of the present invention. FIG. 5 shows the semiconductor structure 100 with the second ILD 128 being planarized to a top surface 130 of the MRAM cell 122. The planarization may include chemical, mechanical, or chemical-mechanical planarization (CMP).

Figure 6:
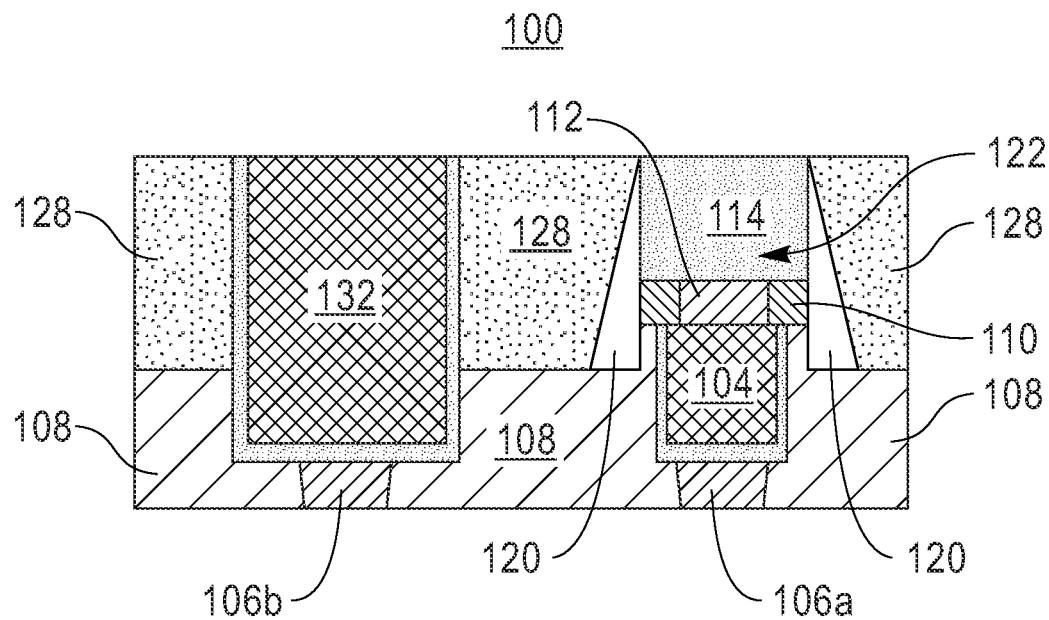
FIG. 6 depicts a schematic cross-sectional side view of the semiconductor structure of FIG. 1, in accordance with one embodiment of the present invention.

FIG. 6 depicts a schematic cross-sectional side view of the semiconductor structure 100 of FIG. 1, in accordance with one embodiment of the present invention. FIG. 6 shows the semiconductor structure 100 with a logic interconnect 132 formed in the ILD 108, 128 above the logic metal level contact 106b. The logic interconnect 132 may be formed as a trench that is cut/etched into the ILD 108, 128 and subsequently filled with one or more electrically conductive materials such as copper, tungsten, cobalt, ruthenium, aluminum, other metals, or conductive non-metals. The logic interconnect 132 is formed independently from the MRAM cell 122, and thus is cut/etched such that the height of the memory array landing pad 104 is different than the height of the logic interconnect 132. The logic interconnect 132 may include a height 134 that is at least as great as a height of the MRAM cell 122. In certain embodiments (such as the logic interconnect 1032 illustrated in FIG. 11), the height 134 of the logic interconnect may exceed the MRAM cell 122.

Figure 7:
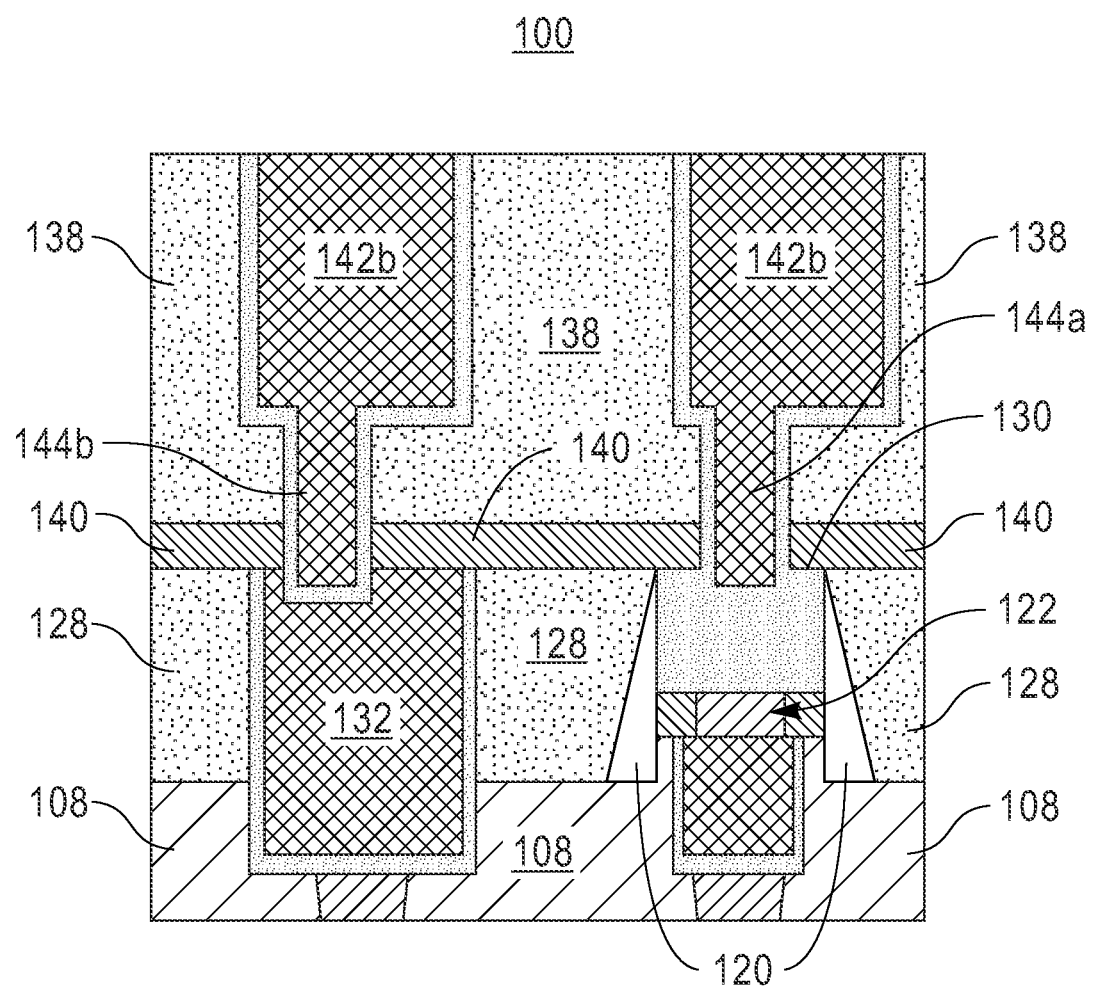
FIG. 7 depicts a schematic cross-sectional side view of the semiconductor structure of FIG. 1, in accordance with one embodiment of the present invention.

FIG. 7 depicts a schematic cross-sectional side view of the semiconductor structure 100 of FIG. 1, in accordance with one embodiment of the present invention. FIG. 7 shows the semiconductor structure 100 with a dielectric cap 140 at the top surface 130 of the MRAM cell 122 and the logic interconnect 132, a third ILD 138, and top lines 142a, b and top vias 144a, b formed through the ILD 138. The top lines 142a, b may be upper lines of consecutive back-end-of line (BEOL) layers in a logic area of the semiconductor structure, with the lower lines being the bottom metal level contacts 106a, b. The dielectric cap 140 is formed independently of the MRAM cell 122 and the logic interconnect 132, and thus can be fabricated with materials and dimensions that do not have to account for the etching of the MRAM pillar 116, or the etch back of the encapsulation spacer 120. The dielectric cap 140 is penetrated by a memory array top via 144a, which electrically connects a memory array top line 142a to the MRAM cell 122. This enables metal levels above the first metal level 102 to electrically communicate with the MRAM cell 122 and change the stored value according to the operation described above. The dielectric cap 140 is also penetrated by a logic top via 144b, which electrically connects a logic top wire 142b to the logic interconnect 132. The logic interconnect 132 is connected to the logic components in a FEOL level below the first metal level 102.

Figure 8:
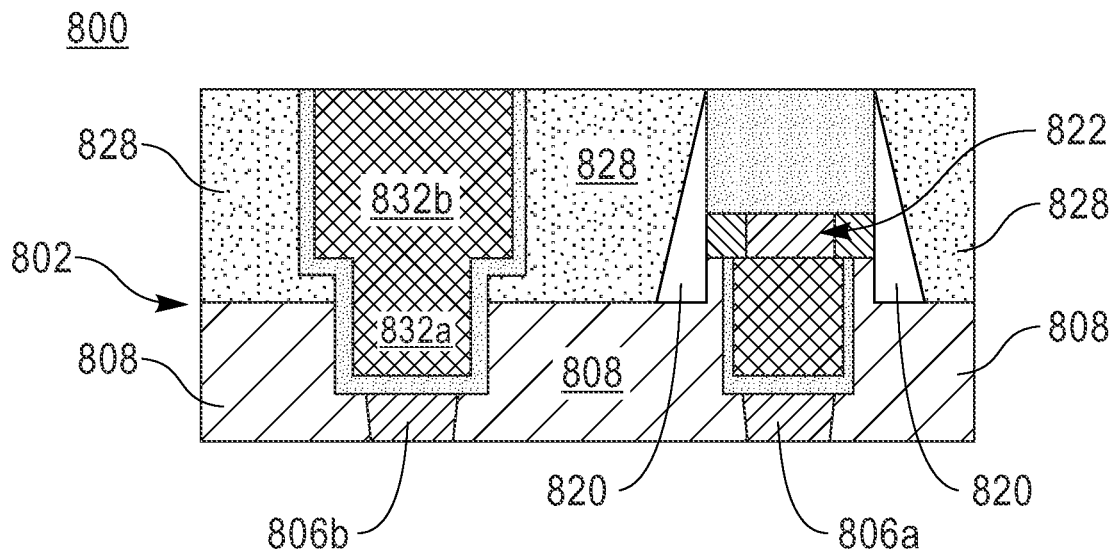
FIG. 8 depicts a schematic cross-sectional diagram of a semiconductor structure, in accordance with one embodiment of the present invention.

FIG. 8 depicts a schematic cross-sectional side view of a semiconductor structure 800, in accordance with one embodiment of the present invention. FIG. 8 shows a fabrication stage of a first metal level 802 after the planarization illustrated in FIG. 5. Specifically, FIG. 8 shows a difference from the previous embodiment in the form of a logic interconnect via 832a and a logic interconnect wire 832b rather than the logic interconnect 132 described previously. The logic interconnect via 832a and the logic interconnect wire 832b are formed after an MRAM cell 822 is formed on a first ILD 808 and covered by a second ILD 828. The logic interconnect via 832a is formed in a hole that contacts a logic metal level contact 806b, and the FEOL level below the first metal level 802. The logic interconnect wire 832b may be formed as a metalized trench, like the logic interconnect 132 of the first embodiment.

Figure 9:
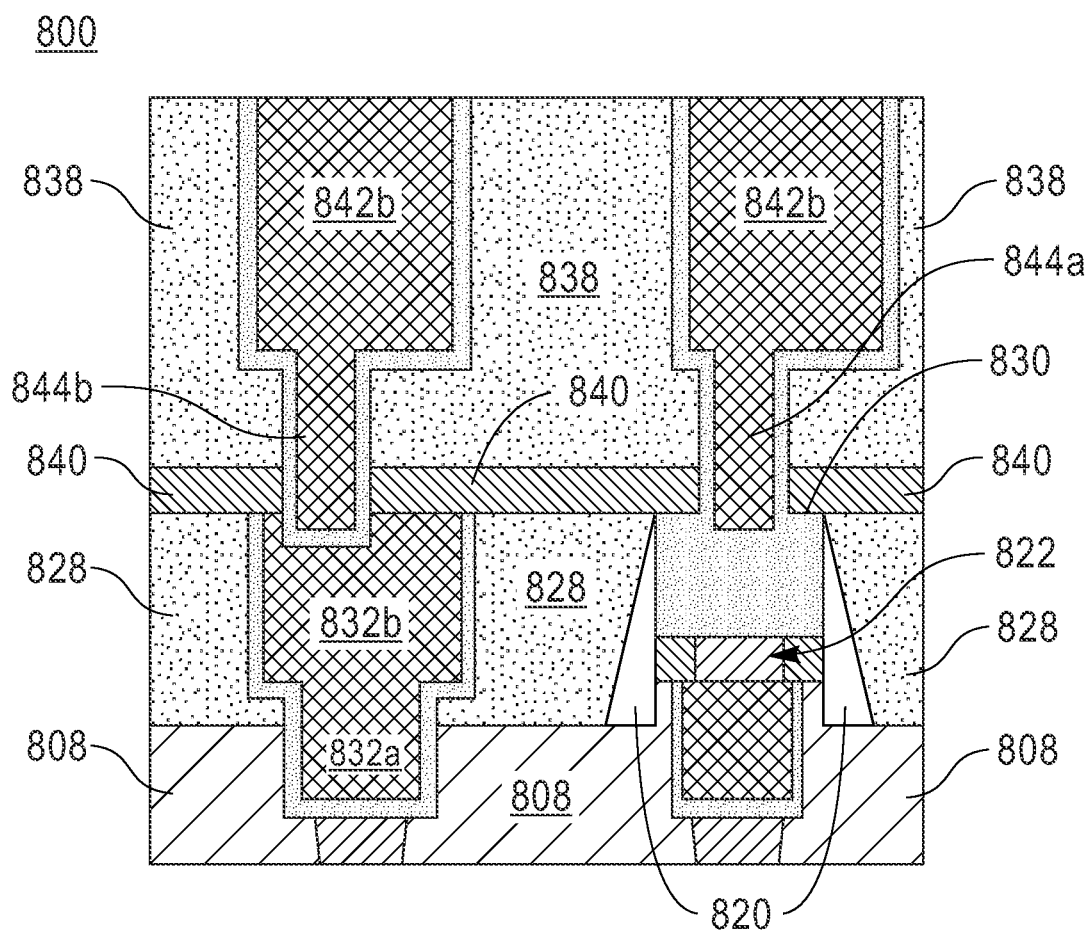
FIG. 9 depicts a schematic cross-sectional side view of the semiconductor structure of FIG. 8, in accordance with one embodiment of the present invention.

FIG. 9 depicts a schematic cross-sectional side view of the semiconductor structure 800 of FIG. 8, in accordance with one embodiment of the present invention. FIG. 9 shows the semiconductor structure 800 with a dielectric cap 840 at a top surface 830 of the MRAM cell 822, a third ILD 838, and top lines 842a, b and top vias 844a, b formed through the ILD 838. The third ILD 838, top lines 842a, b, top vias 844a,

*b* may be formed similarly to the dielectric cap 140, the third ILD 138, the top lines 142*a, b* and top vias 144*a, b* described previously.

Figure 10:
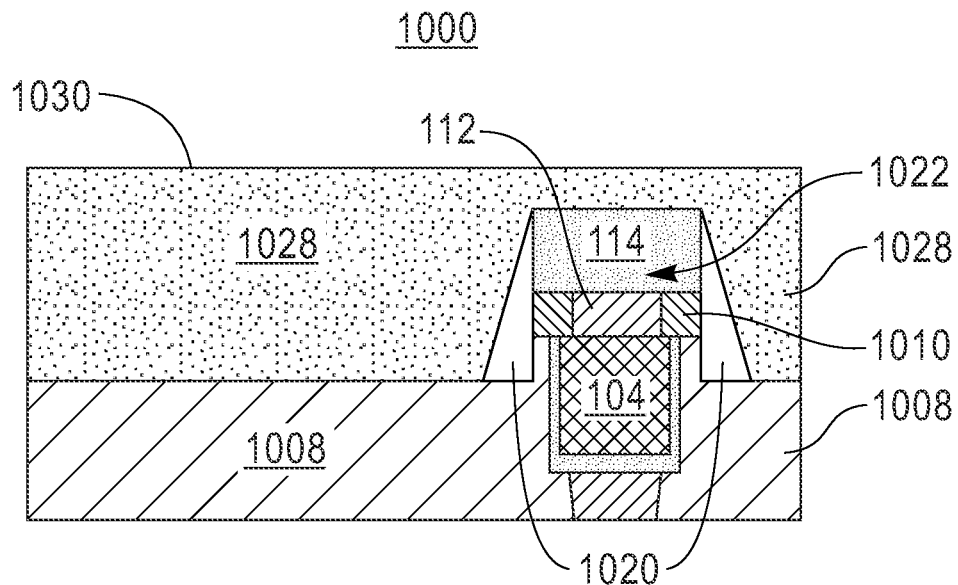
FIG. 10 depicts a schematic cross-sectional diagram of a semiconductor structure, in accordance with one embodiment of the present invention.

FIG. 10 depicts a schematic cross-sectional side view of a semiconductor structure 1000 in accordance with one embodiment of the present invention. FIG. 10 shows the semiconductor structure 1000 having gone through the fabrication stages illustrated in FIGS. 1-4. Rather than planarizing to the top surface 130 of the MRAM cell 122, however, the embodiment shown in FIG. 10 planarizes an ILD 1008, 1028 to a surface 1030 above an MRAM cell 1022. The surface 1030 may be planarized with less precision since the surface 1030 does not need to match exactly with the top of the MRAM cell 1022. The planarization process may terminate after a set amount of time, for example, rather than relying on a termination signal given when the planarization structure contacts the MRAM cell 1022.

Figure 11:
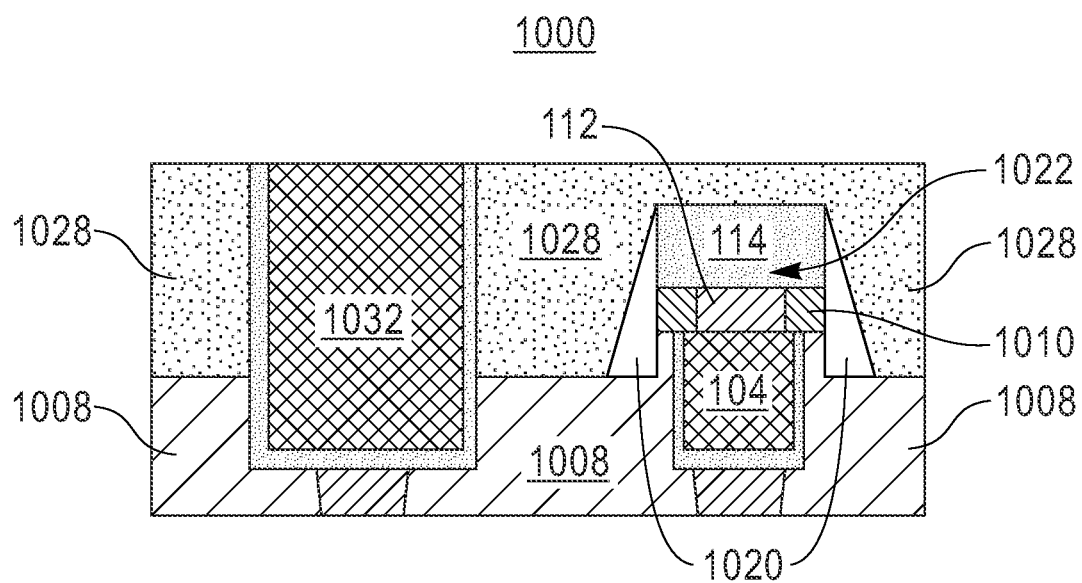
FIG. 11 depicts a schematic cross-sectional side view of the semiconductor structure of FIG. 10, in accordance with one embodiment of the present invention.

FIG. 11 depicts a schematic cross-sectional side view of the semiconductor structure 1000 of FIG. 10, in accordance with one embodiment of the present invention. FIG. 11 shows the semiconductor structure 1000 with a logic interconnect 1032 formed in the ILD 1008, 1028. The logic interconnect 1032 may be formed as a trench that is cut/etched into the ILD 1008, 1028 and subsequently filled with one or more electrically conductive materials such as copper, tungsten, cobalt, ruthenium, aluminum, other metals, or conductive non-metals. The logic interconnect 1032 is formed without overlapping the MRAM cell 1022, and thus the trench is cut/etched independently of the MRAM cell 1022.

Figure 12:
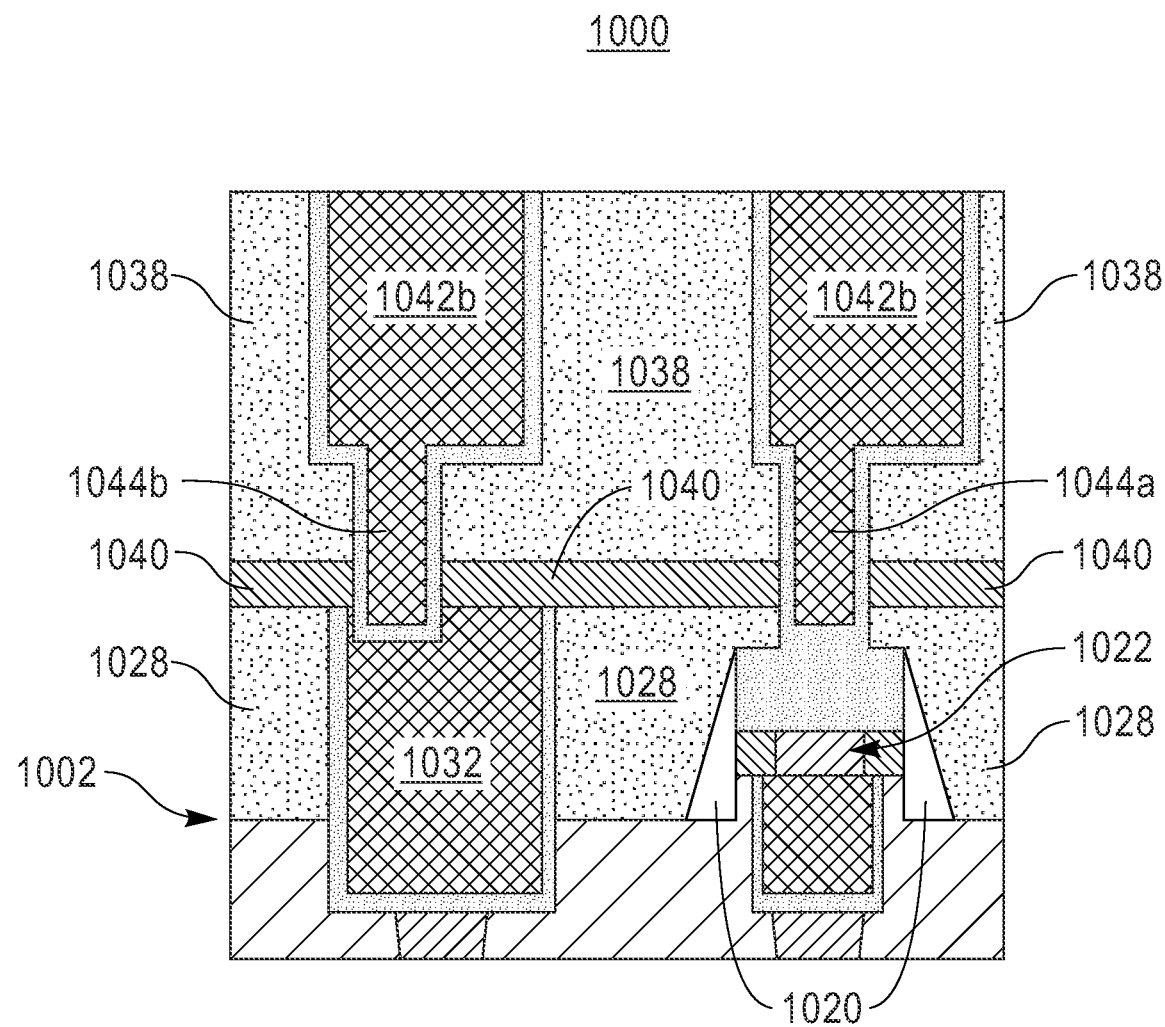
FIG. 12 depicts a schematic cross-sectional side view of the semiconductor structure of FIG. 10, in accordance with one embodiment of the present invention.

FIG. 12 depicts a schematic cross-sectional side view of the semiconductor structure 1000 of FIG. 10, in accordance with one embodiment of the present invention. FIG. 12 shows the semiconductor structure 1000 with a dielectric cap 1040 at the surface 1030, and the logic interconnect 1032, a third ILD 1038, and top lines 1042*a, b* and top vias 1044*a, b* formed through the ILD 1038. The dielectric cap 1040 is formed independently of the MRAM cell 1022 and the logic interconnect 1032, and thus can be fabricated with materials and dimensions that do not have to account for the etching of the MRAM pillar 1016, or the etch back of the encapsulation spacer 1020. The dielectric cap 1040 is penetrated by a memory array top via 1044*a*, which electrically connects a memory array top line 1042*a* to the MRAM cell 1022. This enables metal levels above the first metal level 1002 to electrically communicate with the MRAM cell 1022 and change the stored value according to the operation described above. The dielectric cap 1040 is also penetrated by a logic top via 1044*b*, which electrically connects a logic top wire 1042*b* to the logic interconnect 1032. The logic interconnect 1032 is connected to the logic components in a FEOL level below the first metal level 1002.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a magnetoresistive random access memory (MRAM) cell, comprising:
      a memory array landing pad contacting a first bottom metal level contact; and
      an MRAM pillar electrically connected to the memory array landing pad;
   a logic interconnect, comprising a trench wire directly contacting a second bottom metal level contact; and
   a dielectric cap above the MRAM cell and the logic interconnect, wherein the MRAM cell and logic interconnect are electrically connected to a top metal level through the dielectric cap.

2. The semiconductor structure of claim 1, wherein the first bottom metal level contact and the top metal level are consecutive back-end-of line (BEOL) layers in a logic area of the semiconductor structure.

3. The semiconductor structure of claim 1, further comprising a front end of line (FEOL) level comprising transistor devices, wherein the FEOL level is located below the bottom metal level.

4. The semiconductor structure of claim 1, further comprising an encapsulation spacer encapsulating the MRAM pillar, wherein the encapsulation spacer overlaps at least a portion of the landing pad.

5. The semiconductor structure of claim 1, wherein a height of the landing pad is different than a height of the logic interconnect.

6. The semiconductor structure of claim 1, wherein the MRAM cell comprises interlayer dielectric (ILD) between the MRAM pillar and the dielectric cap.

7. The semiconductor structure of claim 1, wherein the logic interconnect comprises an interconnect via directly connected to the second bottom metal level contact.

8. A method of fabricating a semiconductor structure, comprising:
   forming a memory array landing pad on a first bottom metal level contact;
   forming a magnetoresistive random access memory (MRAM) cell on the memory array landing pad;
   forming interlayer dielectric (ILD) over the MRAM cell; and
   forming a logic interconnect through the ILD, wherein the logic interconnect, wherein the logic interconnect comprises a trench wire that directly contacts a second bottom metal level contact.

9. The method of claim 8, further comprising:
   forming a dielectric cap over the MRAM cell and the logic interconnect; and
   forming a top metal level comprising a first top metal line electrically connected to the MRAM cell and a second top metal line electrically connected to the logic interconnect.

10. The method of claim 8, wherein forming the MRAM cell comprises etching an MRAM pillar through MRAM layers, a dielectric cap, and at least a portion of an ILD material that is formed below the dielectric cap.

11. The method of claim 8, further comprising encapsulating the MRAM pillar in an encapsulation spacer and etching back the encapsulation spacer, wherein the encapsulation spacer vertically overlaps at least a portion of the landing pad.

12. The method of claim 8, further comprising planarizing the ILD to a surface above the MRAM cell.

13. A semiconductor structure, comprising:
a bottom metal level comprising a memory array metal level contact and a logic metal level contact;
a top metal level comprising a first top wire and a second top wire;
a magnetoresistive random access memory (MRAM) cell electrically connected between the memory array metal level contact and the first top wire;
a logic interconnect electrically connected between the logic metal level contact and the second top wire, wherein the logic interconnect comprises a trench wire that is directly connected to the logic metal level contact; and
a dielectric cap directly contacting a top of the logic interconnect, and located between the first top wire and the MRAM cell.

14. The semiconductor structure of claim 13, wherein the logic interconnect comprises a logic interconnect via and a logic interconnect wire.

15. The semiconductor structure of claim 13, wherein the MRAM cell comprises interlayer dielectric (ILD) between the MRAM pillar and the dielectric cap.

16. The semiconductor structure of claim 13, wherein the MRAM cell comprises a landing pad comprising a height that is different than a height of the logic interconnect.

17. The semiconductor structure of claim 13, further comprising a top line above the MRAM cell, wherein the MRAM cell is electrically connected to the top line by a top via.

18. A method, comprising:
forming a first bottom metal level contact and a second bottom metal level contact at a metal level of a semiconductor structure;
forming a memory array landing pad on the first bottom metal level contact;
forming a magnetoresistive random access memory (MRAM) cell on the memory array landing pad;
forming interlayer dielectric (ILD) over the MRAM cell and the second bottom metal level contact; and
forming a logic interconnect through the ILD, wherein the logic interconnect, comprises a trench wire directly contacts the second bottom metal level contact.

19. The method of claim 18, further comprising:
forming dielectric cap over the MRAM cell and the logic interconnect; and
forming a top metal level comprising a first top metal line electrically connected to the MRAM cell and a second top metal line electrically connected to the logic interconnect.

20. The method of claim 18, further comprising planarizing the ILD to a surface above the MRAM cell.

21. A semiconductor structure, comprising:
a magnetoresistive random access memory (MRAM) cell electrically connected between a memory array metal level contact and a first top wire, comprising
an MRAM pillar;
a memory array landing pad; and
an encapsulation spacer vertically encapsulating the MRAM pillar and overlapping at least a portion of the memory array landing pad; and
a logic interconnect electrically connected between a logic metal level contact and a second top wire, wherein the logic interconnect comprises a height that is greater than a height of the MRAM cell.

22. The semiconductor structure of claim 21, further comprising a dielectric cap above the MRAM cell and the logic interconnect, wherein the MRAM cell is electrically connected to the first top wire through the dielectric cap, and the logic interconnect is electrically connected to the second top wire through the dielectric cap.

* * * * *